United States Patent
Baks et al.

(10) Patent No.: US 7,358,182 B2
(45) Date of Patent: Apr. 15, 2008

(54) METHOD OF FORMING AN INTERCONNECT STRUCTURE

(75) Inventors: Heidi Lee Baks, Poughkeepsie, NY (US); Shyng-Tsong Chen, Patterson, NY (US); Timothy Joseph Dalton, Ridgefield, CT (US); Nicholas Colvin Masi Fuller, Ossining, NY (US); Kaushik Arun Kumar, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 246 days.

(21) Appl. No.: 11/315,923

(22) Filed: Dec. 22, 2005

(65) Prior Publication Data

US 2007/0148966 A1    Jun. 28, 2007

(51) Int. Cl.
  *H01L 21/4763*    (2006.01)
(52) U.S. Cl. ............... 438/637; 438/736; 438/743; 257/E21.579
(58) Field of Classification Search ........ 438/637–640, 438/668, 717, 736, 743, 946
  See application file for complete search history.

(56) References Cited

U.S. PATENT DOCUMENTS

| 6,140,226 | A | 10/2000 | Grill et al. | |
|---|---|---|---|---|
| 6,147,009 | A | 11/2000 | Grill et al. | |
| 6,312,793 | B1 | 11/2001 | Grill et al. | |
| 6,756,323 | B2 | 6/2004 | Grill et al. | |
| 6,768,200 | B2 | 7/2004 | Grill et al. | |
| 6,806,203 | B2 * | 10/2004 | Weidman et al. | 438/736 |
| 6,927,495 | B2 * | 8/2005 | Arita et al. | 257/758 |
| 6,930,052 | B2 * | 8/2005 | Schwarzl et al. | 438/738 |
| 7,112,615 | B2 * | 9/2006 | Gleason et al. | 521/77 |
| 2005/0191852 | A1 * | 9/2005 | Takigawa et al. | 438/637 |

OTHER PUBLICATIONS

Grill, et al.; Structure of low dielectric constant to extreme low dielectric constant SiCOH films: Fourier transform infrared spectroscopy characterization; 2003 American Institute of Physics; Journal of Applied Physics; vol. 94, No. 10; Nov. 15, 2003; pp. 6697-6707; 0021-89792003/94(10)/6697/11.

* cited by examiner

*Primary Examiner*—Michael S. Lebentritt
*Assistant Examiner*—Reema Patel
(74) *Attorney, Agent, or Firm*—Schmeiser, Olsen & Watts; Robert M. Trepp

(57) ABSTRACT

A method of forming damascene interconnect structure in an organo-silicate glass layer without causing damage to the organo-silicate glass material. The method includes forming a stack of hardmask layers over the organo-silicate glass layer, defining openings in the hardmask and organo-silicate glass layers using a combination of plasma etch and plasma photoresist removal processes and performing one or more additional plasma etch processes that do not include oxygen containing species to etch the openings to depths required for forming the damascene interconnect structures and to remove any organo-silicate material damaged by the combination of plasma etch and plasma photoresist removal processes.

11 Claims, 7 Drawing Sheets

METHOD OF FORMING AN INTERCONNECT STRUCTURE

FIELD OF THE INVENTION

The present invention relates to the field of fabrication of integrated circuits; more specifically, it relates to methods of fabricating interconnect structures in organo-silicate glass based dielectric layers.

BACKGROUND OF THE INVENTION

Generally, integrated circuit chips include a plurality of devices such as resistors, capacitors, inductors, diodes and transistors wired together into circuits by layers of interconnect structures formed in dielectric layers that are stacked on top of each other.

There are two limiting factors that affect the speed of signal propagation in the interconnect structures, namely, the resistance (R) of the interconnects and the capacitance (C) of the dielectric layer which manifests themselves as an RC delay. Signal delay can be reduced by using low dielectric constant (k) dielectrics, one family of which are called organo-silicate glass (OSG).

However OSG materials are not easily integrated into common integrated circuit fabrication processes. Exposing OSG materials to plasma-based processes can cause image control problems in photoresist layers by release of amines from the OSG material (e.g. photoresist poisoning). Plasma based processing also causes carbon-depletion of the OSG material which leads to increased leakage current flow between unconnected interconnect structures in layers of OSG material as well as interconnect metallurgy/OSG interface adhesion loss.

Therefore there is a need for a method of forming interconnect structures in OSG dielectrics that does not cause photoresist poisoning, is insensitive to OSG carbon-depletion and is less susceptible to interconnect/OSG interface adhesion failure.

SUMMARY OF THE INVENTION

A first aspect of the present invention is a method, comprising: forming an organo-silicate glass layer over a substrate; forming a first hardmask layer over the organo-silicate glass layer; forming a second hardmask layer over the first hardmask layer; forming a photoresist layer over the second hardmask layer; removing a region of the photoresist layer; removing a region of the second hardmask layer where the second hardmask layer is not protected by the photoresist layer using a first plasma etch process; removing the photoresist layer; removing the first hardmask layer where the first hardmask layer is not protected by the second hardmask layer and removing a less than whole portion of the organo-silicate glass layer in a region of the organo-silicate glass layer not protected by the first hardmask layer using a second plasma etch process; and removing all remaining portions of the organo-silicate glass layer in the region of the organo-silicate glass layer not protected by the first hardmask layer using a third plasma etch process to form a trench extending completely through the organo-silicate glass layer.

A second aspect of the present invention is a method, comprising: forming an organo-silicate glass layer over a substrate; forming a first hardmask layer over the organo-silicate glass layer; forming a second hardmask layer over the first hardmask layer; forming a first photoresist layer over the second hardmask layer; removing a region of the first photoresist layer; removing a region of the second hardmask layer where the second hardmask layer is not protected by the first photoresist layer using a first plasma etch process to define a wire pattern in the second hardmask layer; removing the first photoresist layer; forming a second photoresist layer over the second hardmask layer and exposed surfaces of the first hardmask layer; removing a region of the second photoresist layer; performing a second plasma etch process to remove a region of the first hardmask layer to define a via pattern in the first hardmask layer, the via pattern aligned at least partially within the wire pattern, the second plasma etch removing a less than whole portion of a first region of the organo-silicate glass layer where the organo-silicate glass layer is not protected by the first hardmask layer; removing the second photoresist layer; performing a third plasma etch process, the third plasma process removing the first hardmask layer in regions of the first hardmask layer not protected by the second hardmask layer, removing a less than whole portion of a second region of the organo-silicate glass layer within a perimeter of the wire pattern and removing an additional less than whole portion of the organo-silicate glass layer in the first region of the organo-silicate glass layer; and performing a fourth plasma etch process, the fourth plasma etch process removing an additional less than whole portion of the organo-silicate glass layer in the second region of the organo-silicate glass layer to form a wire trench and removing all remaining portions of the organo-silicate glass layer in the first region of the organo-silicate glass layer to form a via opening.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
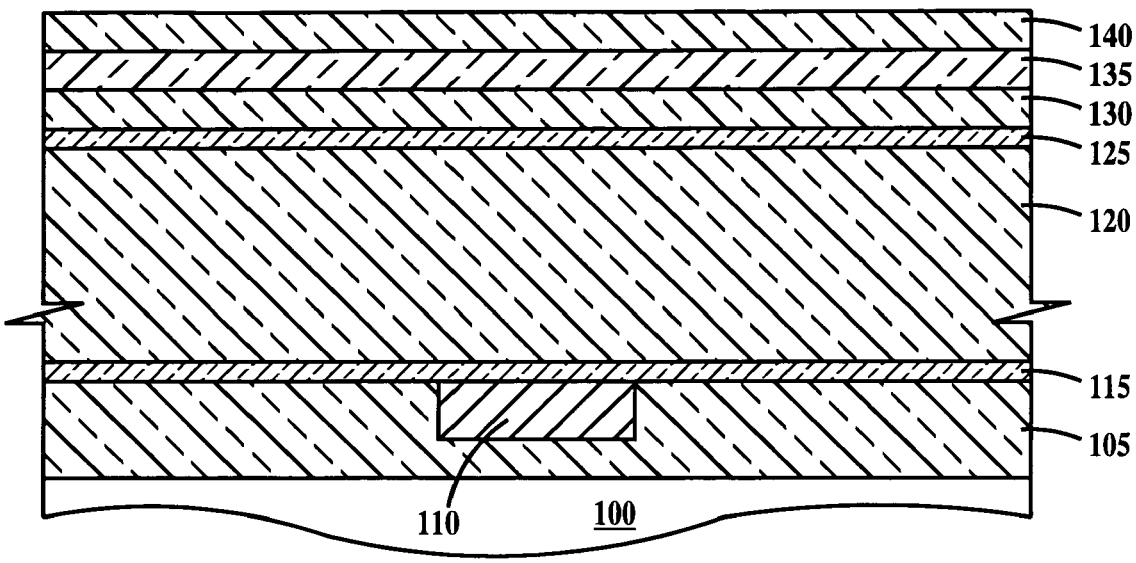
FIGS. 1 through 10 are cross-sectional views illustrating fabrication of an interconnect structure according to a first embodiment of the present invention.

Interconnect structures according to the present invention are formed by damascene processes and are either single or dual damascene interconnect structures. For the purpose of describing the various embodiments of the present invention wires, vias and via bars are to be considered types of interconnect structures. While common vias are generally approximately square or round, via bars are elongated, or approximately rectangular shaped vias. Interconnect structures are formed in an insulating layer often called an interlevel dielectric (ILD).

A damascene process is one in which wire trenches or via openings are formed in a dielectric layer, an electrical conductor of sufficient thickness to fill the trenches is deposited on a top surface of the dielectric and a chemical-mechanical-polish (CMP) process is performed to remove excess conductor and make the surface of the conductor co-planer with the surface of the dielectric layer to form damascene wires (or damascene vias). When only a trench and a wire (or a via opening and a via or a via trench and via bar) is formed the process is called single-damascene. (Note, a via opening may also be considered a trench.)

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planer with the surface the dielectric layer to form dual-damascene wires and dual-damascene wires having integral dual-damascene vias.

OSG materials are used in the various embodiments of the present invention. The OSG materials may be spun-on a wafer or substrate to form an OSG layer or may be formed by plasma enhanced chemical vapor deposition (PECVD) over a wafer or substrate to form an OSG layer.

Examples of OSG materials suitable for spin apply include hydrogen silsesquioxane polymer (HSQ), methyl silsesquioxane polymer (MSQ), Black Diamond™ (methyl doped silica or $SiO_x(CH_3)_y$, or $SiC_xO_yH_y$, or SiOCH ) manufactured by Applied Materials, Santa Clara, Calif., and porous OSG. Porous OSG material is OSG containing voids or pores having a size distribution between about 1 and about 25 nm.

Pores may be introduced into spun on OSG materials by any number of methods well known in the art. In one example pores are introduced into OSG materials by mixing a porogen (pore generating agent) with uncured OSG resin, forming a layer of the mixture and removing the porogen (by volatilization or decomposition of the porogen) as the OSG resin is heat cured (converted into a polymer). Voids are left in the OSG where porogen had originally been.

In a first example, OSG materials have a dielectric constant of less than 5. In a second example, OSG materials have a dielectric constant of less than 3.5. In a third example, OSG materials have a dielectric constant of less than 3.

Further examples of silsesquioxane based OSG materials are resins (low molecular weight polymers or oligomers) or polymers that may be represented by structures (I), (II), (III) and (IV).

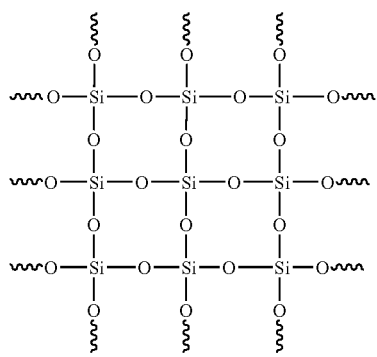
(I)

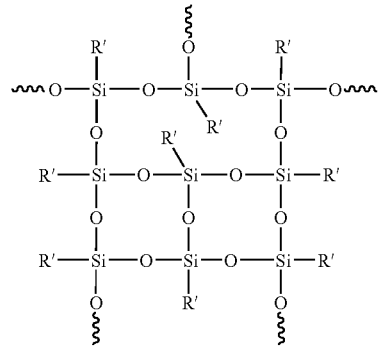
(II)

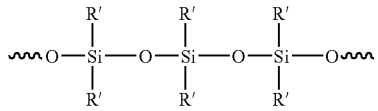
(III)

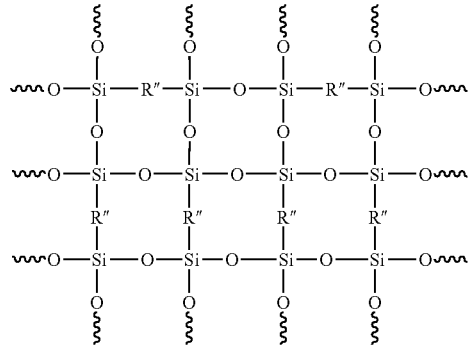
(IV)

wherein R' is selected from the group consisting of an alkyl group having 1 to 3 carbon atoms, an aryl group having 6 to 12 carbon atoms, and a cycloalkyl group having 6 to 12 carbon atoms, and wherein R" is selected from the group consisting of an alkylene group having 1 to 2 carbon atoms and a cycloalkylene group having 6 to 12 carbon atoms.

Structure (I) may be represented by the formula $—(SiO_2)n—$, structure (II) may be represented by the formula $—(R'SiO_{3/2})n—$, structure (III) may be represented by the formula $—(R'_2SiO)n—$ and structure (IV) may be represented by the formula $—(R''Si_2O_3)n—$.

In one example, the atomic composition of OSG materials used in the various embodiments of the present invention comprise about 10% to about 40% silicon, about 0% to about 30% carbon, about 0% to about 30% nitrogen, and about 20% to about 50% hydrogen.

Examples of OSG materials formed by PECVD may be found in U.S. Pat. No. 6,147,009 by Grill et al. which issued Nov. 14, 2000 and is directed to forming layers of dense SiCOH and which is hereby incorporated by reference in its entirety. Examples of forming multi phase or porous OSG materials by PECVD are found in U.S. Pat. No. 6,312,793 by Grill et al. which issued Nov. 6, 2001, U.S. Pat. No. 6,756,323 by Grill et al. which issued Jun. 29, 2004 and U.S. Pat. No. 6,768,200 by Grill et al. which issued Jul. 27, 2004 all of which are hereby incorporated by reference in there entireties.

Examples of OSG materials formed by PECVD may be represented by structures (V) and (VI).

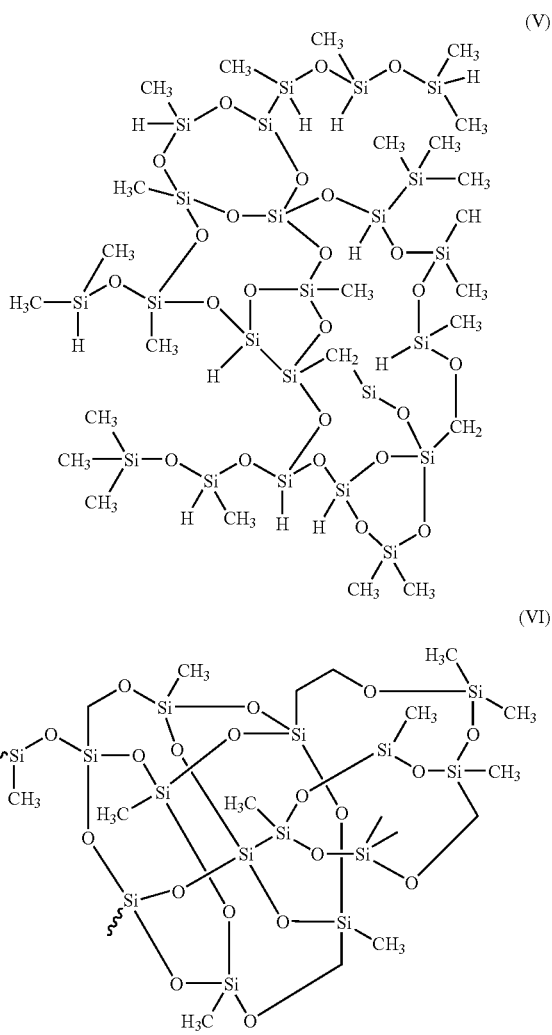

PECVD OSG may be formed using a first precursor selected from molecules containing at least some of Si, C, O, and H atoms. Oxidizing molecules such as $O_2$ or $N_2O$ can be added to the first precursor. Preferably the first precursor is selected from molecules with ring structures such as 1,3,5,7-tetramethylcyclotetrasiloxane (TMCTS or $C_4H_{16}O_4Si_4$), tetraethylcyclotetrasiloxane ($C_8H_{24}O_4Si_4$), decamethylcyclopentasiloxane ($C_{10}H_{30}O_5Si_5$) molecules of methylsilanes mixed with an oxidizing agent such as $O_2$ or $N_2O$ or precursor mixtures including Si, O and C. The precursor can be delivered directly as a gas to the reactor, delivered as a liquid vaporized directly within the reactor, or transported by an inert carrier gas such as helium or argon. The precursor mixture may further contain elements such as nitrogen, fluorine or germanium.

PECVD porous OSG may be formed using a mixture of the first precursor and a second precursor gas mixture selected from molecules containing C and H atoms. Optionally, O, N or F atoms may be contained in the molecules, or molecules containing such atoms may be added to the precursor mixture. In one example, the second precursor is selected from the group comprising molecules with ring structures containing C and H atoms such as cyclic hydrocarbons, cyclic alcohols, cyclic ethers, cyclic aldehydes, cyclic ketones, cyclic esters, pheonols, cyclic amines, or other O, N or F containing cyclic hydrocarbons. More preferably, the second precursor molecule is a multicyclic (or polycyclic) hydrocarbon containing about 6 to 12 carbon atoms, with preferred examples being 2,5-norbornadiene (also known as bicyclo[2.2.1]hepta-2,5-diene), norbornylene 2,5-norbornadiene (also known as bicyclo [2.2.1]hepta-2,5-diene), norbornane (also known as bicyclo[2.2.1]heptane). Other examples are tricyclo[3.2.1.0]octane, tricyclo[3.2.2.0]nonane, connected ring hydrocarbons such as spiro[3.4]octane, spirol[4.5]nonane, spiro[5.6]decane, and the like. Alternatively, cyclic hydrocarbons containing from 5 to 12 carbon atoms (cyclopentane, cyclohexane, and the like) and also cyclic aromatic hydrocarbons containing 6 to 12 C atoms (benzene, toluene, xylenes, and the like) may be used. Optionally, O or F atoms may be contained in the molecules, or molecules containing such atoms added to the precursor mixture.

FIGS. 1 through 10 are cross-sectional views illustrating fabrication of an interconnect structure according to a first embodiment of the present invention. In FIG. 1, a substrate 100 may be a bulk silicon (Si) substrate or a silicon-on-insulator (SOI) substrate. In one example, substrate 100 comprises Si, silicon-germanium (SiGe), layers of Si, layers of SiGe, silicon dioxide ($SiO_2$) or combinations thereof. Substrate 100 may include devices such as resistors, capacitors, inductors, diodes, transistors and contacts to the devices or substrate. In FIG. 1, a dielectric layer 105 is formed on top of substrate 100 and includes, by way of example, a contact 110. In one example, dielectric layer 105 comprises $SiO_2$ and contact 110 comprises tungsten (W). Formed on top of dielectric layer 110 is an optional capping layer 115. In one example, capping layer 115 comprises silicon nitride ($Si_3N_4$), silicon carbide (SiC), silicon oxycarbide (SiOC), $SiO_2$, OSG, low-K dielectrics or combinations of layers thereof and has a thickness of between about 2 nm and about 30 nm. Capping layer 115 may act as a moisture barrier, ionic contamination barrier, copper diffusion barrier or combinations thereof. A low-K dielectric is a dielectric with a dielectric constant of about 3 or less.

Formed on top of capping layer 115 is an OSG or a porous OSG layer 120. Hereinafter, the term OSG layer includes either a layer of OSG material or a layer of porous OSG material as described supra. In one example a porous OSG layer comprises about 10% to about 70% voids by volume. In one example OSG layer 120 is between about 100 nm and about 1500 nm thick.

Formed on top of OSG layer 120 is an optional adhesion layer 125. Formed on top of adhesion layer 125 is a first hardmask layer 130. Formed on top of first hardmask layer 130 is an optional rework protection layer 135. Formed on top of rework protection layer 135 is second hardmask layer 140.

Adhesion of first hardmask layer 130 to OSG layer 120 can be enhanced either by plasma pre-treatment of the top surface of the OSG layer to form adhesion layer 125 or by deposition or application of adhesion layer 125 on top of the OSG layer before deposition of first hardmask layer 130.

First hardmask layer 130 serves multiple purposes. Hardmask layer 130 acts as chemical-mechanical polish (CMP) stopping layer as described infra, as a barrier layer to protect OSG layer 120 from moisture and slurry solvents, and as a template to enable the patterning of the OSG layer. In one example, first hardmask layer 130 comprises $Si_3N_4$, SC, SiOC, hydrogenated silicon carbide (SiOCH), $SiO_2$, OSG, a low-K dielectric or combinations of layers thereof.

Keeping in view of the fact that first hardmask 130, or a layer thereof, is retained after CMP; it is advantageous to have a low-K material as the hardmask, so as to keep the effective dielectric constant of the entire stack low. The major drawback of this requirement is that materials that satisfy this condition are susceptible to photoresist rework conditions that typically involve oxygen-based plasma strip conditions. Hence, in order to protect first hardmask layer 130 from damaging photoresist strip conditions, rework protection layer 135 may be used. In one example, rework protection layer 135 comprises $Si_3N_4$, SiO2, SiOC, titanium (Ti), tantalum (Ta), other refractory metals, tantalum nitride (TiN), tantalum nitride (TaN), other refractory metal nitrides or combinations of layers thereof. However, if first hardmask layer 130 is resistant to photoresist rework conditions, rework protection layer 135 is not required. In one example, photoresist rework includes removal of the photoresist using a plasma process that includes $O_2$ or oxygen containing species.

In one example, second hardmask layer 140 comprises $Si_3N_4$, $SiO_2$, silicon oxynitride ($Si_XO_YN_Z$) or combinations of layers thereof.

Figure 2:
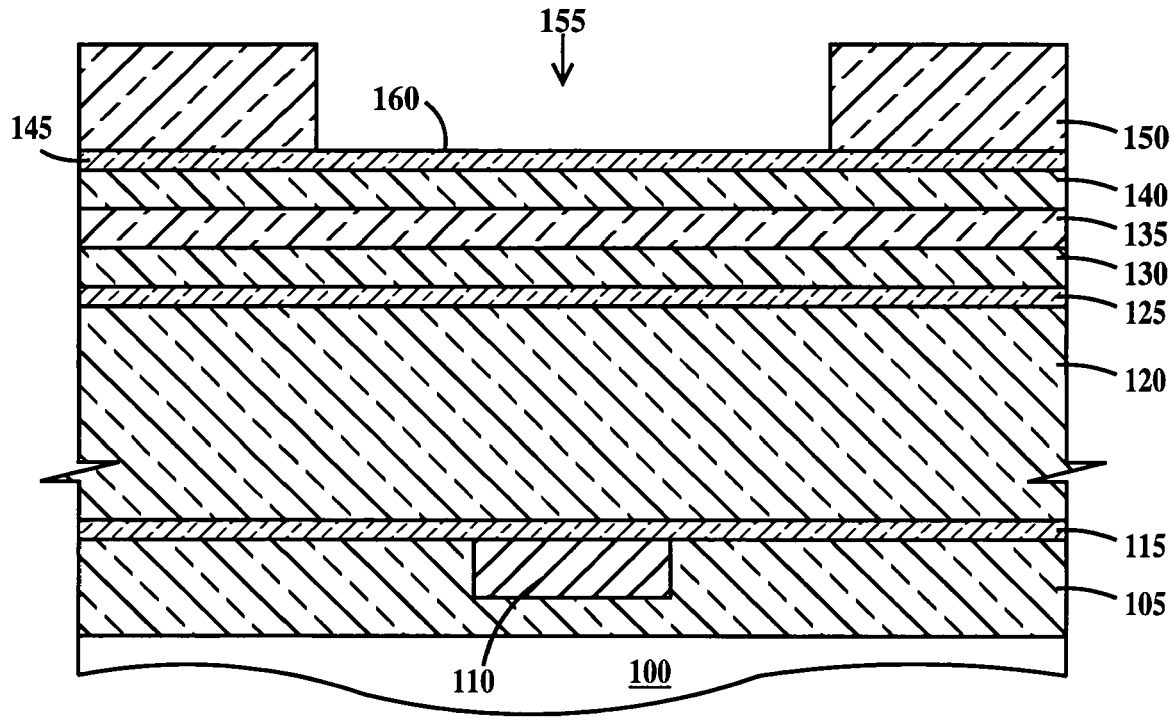

In FIG. 2, an optional anti-reflective coating (ARC) 145 is formed on second hardmask layer 140 and a photoresist layer 150 is formed on ARC 145. An opening 155 is formed in the photoresist layer by conventional photolithographic processing (e.g. exposing a photoresist layer to actinic radiation through a patterned mask and removing the exposed or unexposed photoresist), thus exposing a top surface 160 of ARC 145.

In one example ARC 145 comprises 414J available from Japan Synthetic Rubber (JSR).

Figure 3:
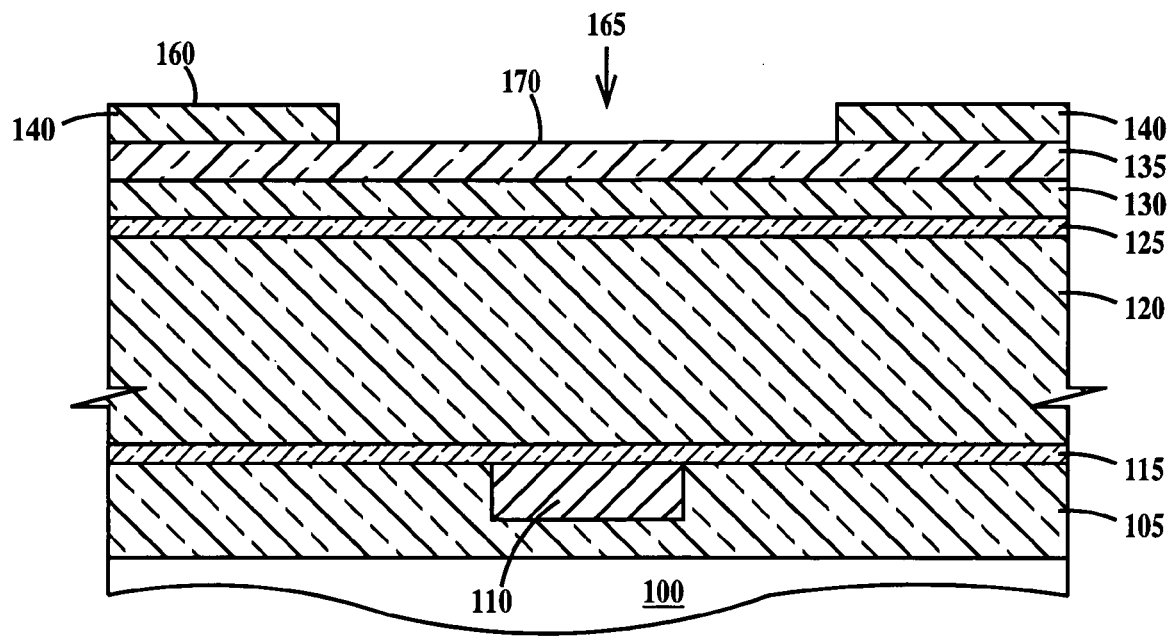

In FIG. 3, a first plasma etch is performed to remove exposed ARC 145 (see FIG. 2), and to remove subsequently exposed second hardmask layer 140, followed by a first plasma photoresist strip to remove photoresist layer 150 and any remaining ARC 145 (see FIG. 2), thus forming an opening 165 in second hardmask layer 140 and exposing a top surface 170 of rework protection layer 135. (If rework protection layer 135 is not present, then a top surface of first hardmask 130 would be exposed in opening 165.) After the first plasma photoresist strip, an optional wet clean in water or an aqueous acidic solution is performed. In one example, the optional wet clean removes up to about 20 Å of second hardmask layer 140.

In one example, the first plasma etch is performed using a chlorine containing gaseous compound, chlorine ($Cl_2$), boron tri-chloride ($BCl_3$), a fluorine containing gaseous compound, mono-fluoro methane ($CH_3F$), di-fluoro methane ($CH_2F_2$), tri fluoro methane ($CHF_3$) or combinations thereof mixed with oxygen ($O_2$), nitrogen ($N_2$). hydrogen ($H_2$) or combinations thereof. In one example, the first plasma photoresist strip process is performed using $O_2$, $N_2$, $H_2$ or combinations thereof.

Figure 4:
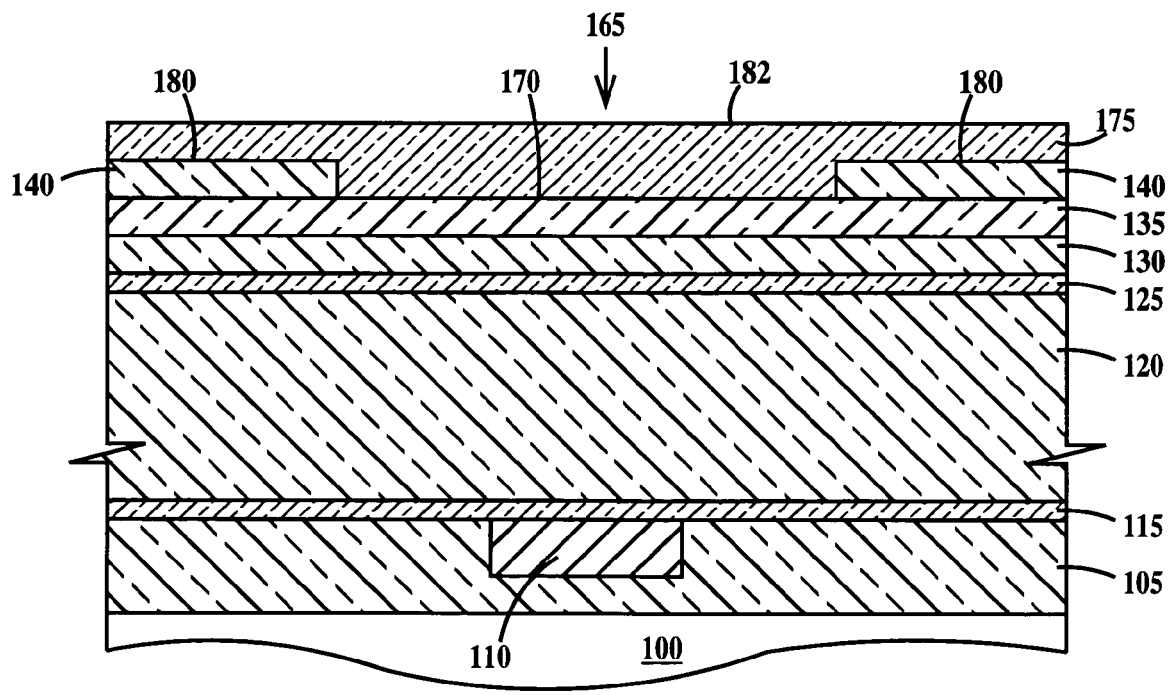

In FIG. 4, an optional ARC 175 is formed over top surface 170 of rework protection layer 135 exposed in opening 165 in second hardmask layer 140 and over top surface 180 of remaining second hardmask layer 140. ARC 175 may comprise the same material as described for ARC 145 supra. In one example ARC 175 is planar, i.e. there is no dip in a top surface 182 of ARC 175 over opening 165.

Figure 5:
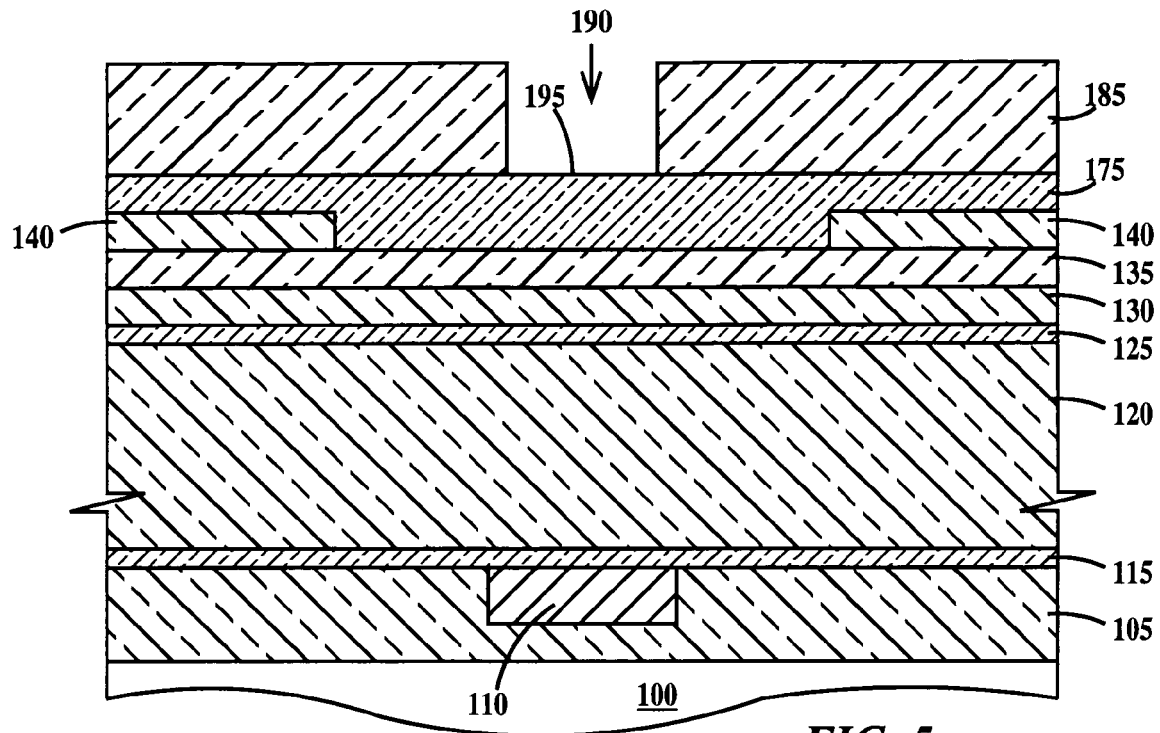

In FIG. 5, a photoresist layer 185 is formed on ARC 175. An opening 190 is formed in the photoresist layer by conventional photolithographic processing as described supra, thus exposing a top surface 195 of ARC 175.

Figure 6:
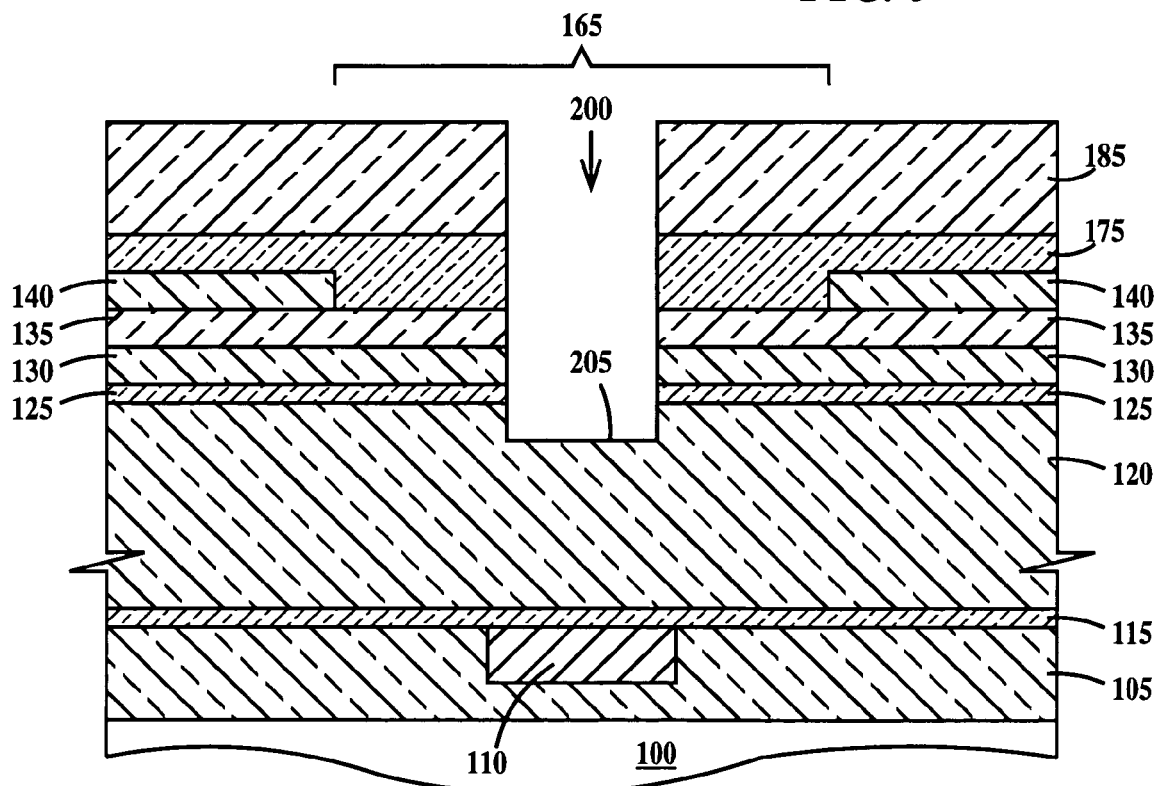

In FIG. 6, a second plasma etch is performed to remove exposed ARC 175 and to etch an opening 200 through rework protection layer 135, first hardmask layer 130, adhesion layer 125 and into but not completely through OSG layer 120. OSG material of OSG layer 120 is exposed in a bottom 205 of opening 200. Opening 200 is aligned within opening 165 in second hardmask layer 140. In one example, the second plasma etch is performed using a fluorine containing gaseous compound, $CH_3F$, $CH_2F_2$, $CHF_3$ or combinations thereof mixed with $O_2$, $N_2$, $H_2$ or combinations thereof. In one example, the second plasma etch is non-selective to ARC 175, rework protection layer 135, first hardmask mask layer 130, adhesion layer 125 and OSG layer 120.

Figure 7:
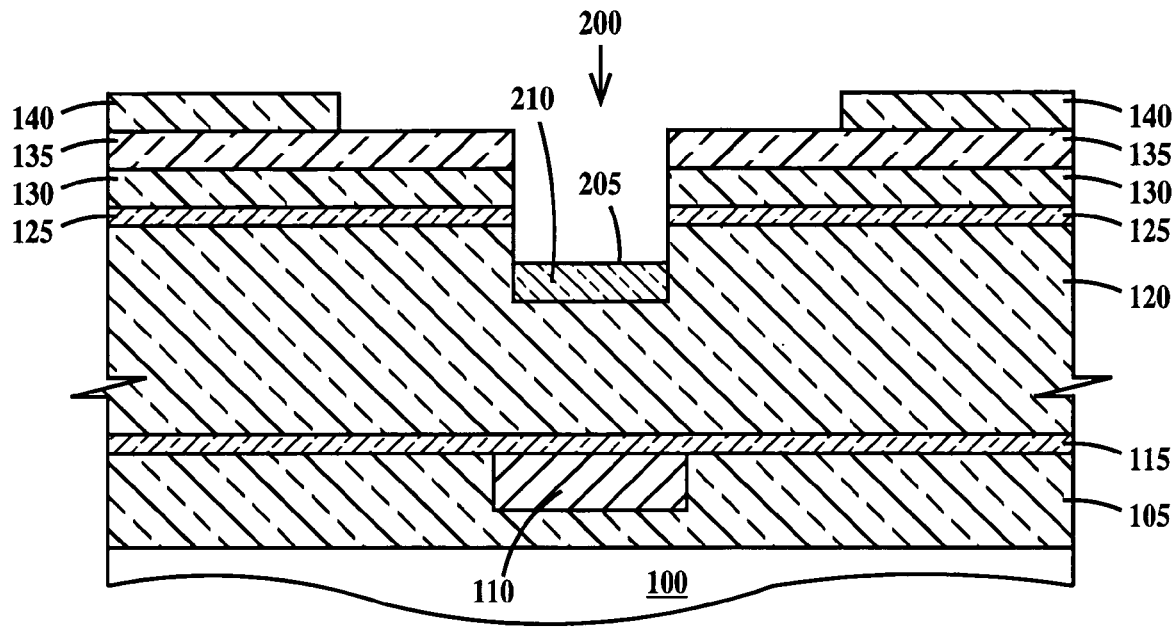

In FIG. 7, a second plasma photoresist strip is performed to remove photoresist layer 185 and any remaining ARC 175 (see FIG. 6). In one example, the second plasma photoresist strip process is performed using $O_2$, $N_2$, $H_2$ or combinations thereof.

A damaged region 210 of OSG layer 120 is formed extending from bottom 205 of opening 200 into OSG layer 120. Damaged region 210 may include carbon depleted OSG material caused by $O_2$ or oxygen containing species used in the second plasma etch and/or the second plasma photoresist strip.

Figure 8:
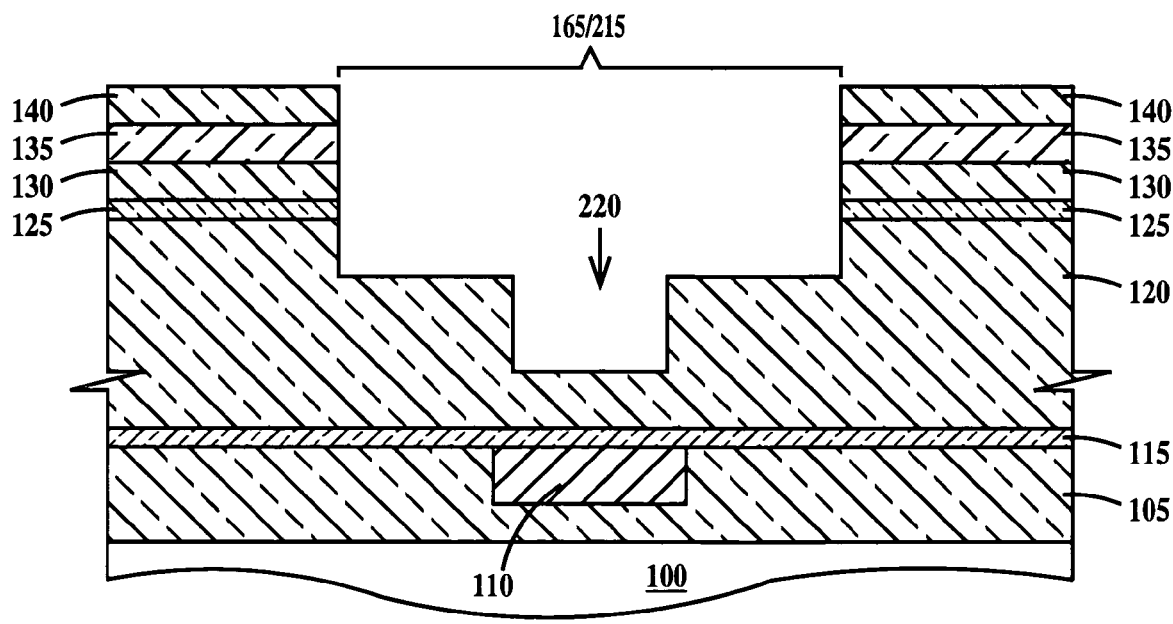

In FIG. 8, a third plasma etch is performed which etches rework protection layer 135, first hardmask layer 130, adhesion layer 125 and OSG layer 120 selectively to second hardmask layer 140. The third plasma etch defines an opening 215 in rework protection layer 135, first hardmask layer 130, adhesion layer 125 and OSG layer 120 using opening 165 in second hardmask layer 140 as a mask. At the same time, opening 200 (see FIG. 7) is extended in depth to form an opening 220 in OSG layer 120 and damaged region 210 (see FIG. 7) is removed. In order that the third plasma etch not cause further damage to OSG layer 120 (and in fact remove any damage already present), the third plasma etch does not include $O_2$ or oxygen containing species. In one example, the third plasma etch is a polymer forming etch. A polymer forming etch, forms fluorocarbon polymers on the sidewalls and bottom of the opening being etched which is continuously removed and redeposited on the bottom of the opening as the opening is progressively etched deeper. In one example, the third plasma etch is performed using a fluorine containing gaseous compound, $CH_3F$, $CH_2F_2$, $CHF_3$, $C_XF_Y$ (where X and Y are positive integers) or combinations thereof mixed with $N_2$, $H_2$, Ar, Ne, Kr, Xe or combinations thereof.

It should be noted, that no regions of OSG layer 120 exposed in openings 215 and 220 are "damaged" by the third plasma etch.

Figure 9:
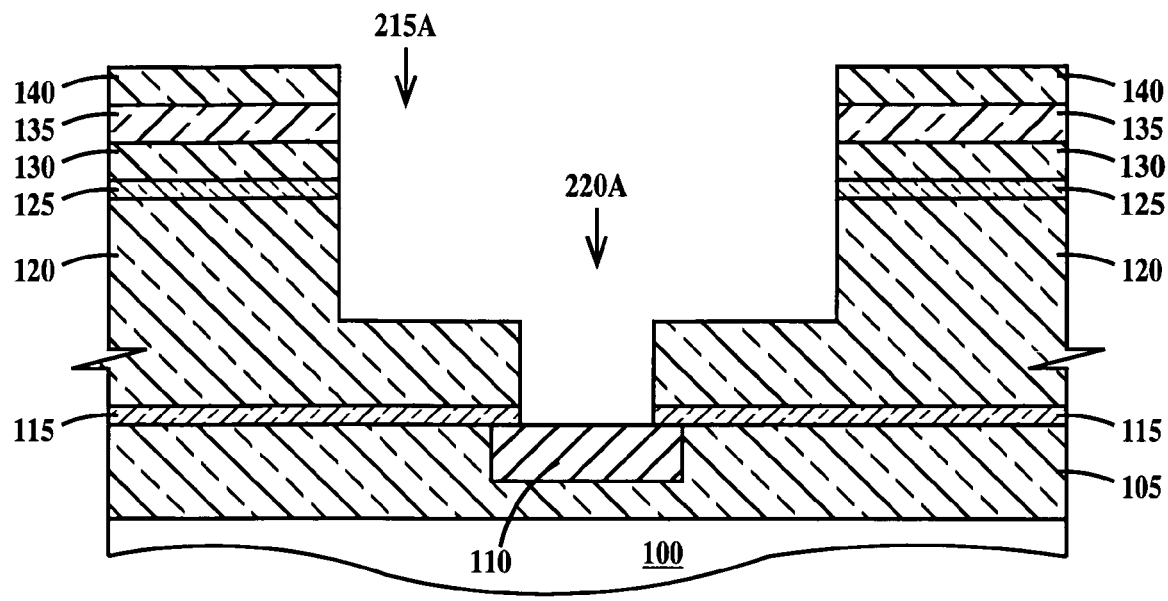

In FIG. 9, a fourth plasma etch is performed in which OSG layer 120 is etched selective to second hardmask layer 140 and capping layer 115. In order that the fourth plasma etch not cause further damage to OSG layer 120, the fourth plasma etch does not include $O_2$ or oxygen containing species. In another example, the fourth plasma etch does not include $O_2$, oxygen containing species or $N_2$. In one example, the fourth plasma etch is performed using a fluorine containing gaseous compound, $C_XF_Y$ (where X and Y are positive integers) or combinations thereof mixed with an inert gas, Ar, Ne, Kr, Xe or combinations thereof.

In order to remove capping layer 115 from via opening 220A, a fifth plasma etch is performed which OSG layer 120 is etched selective to second hardmask layer 140 and capping layer 115. In order that the fifth plasma etch not cause further damage to OSG layer 120, the fifth plasma etch does not include $O_2$ or oxygen containing species. In one example, the fifth plasma etch is performed using a fluorine containing gaseous compound, $CH_3F$, $CH_2F_2$, $CHF_3$, $C_XF_Y$ (where X and Y are positive integers) or combinations thereof mixed with $N_2$, Ar, Ne, Kr, Xe or combinations thereof.

The fourth and fifth plasma etches define a wire trench 215A and a via opening 220A by extending the depth of openings 215 and 220 (see FIG. 8) to the depths required to form a dual damascene interconnect. It should be noted, that no regions of OSG layer 120 exposed in via opening 215A and wire trench 220A are "damaged."

Figure 10:
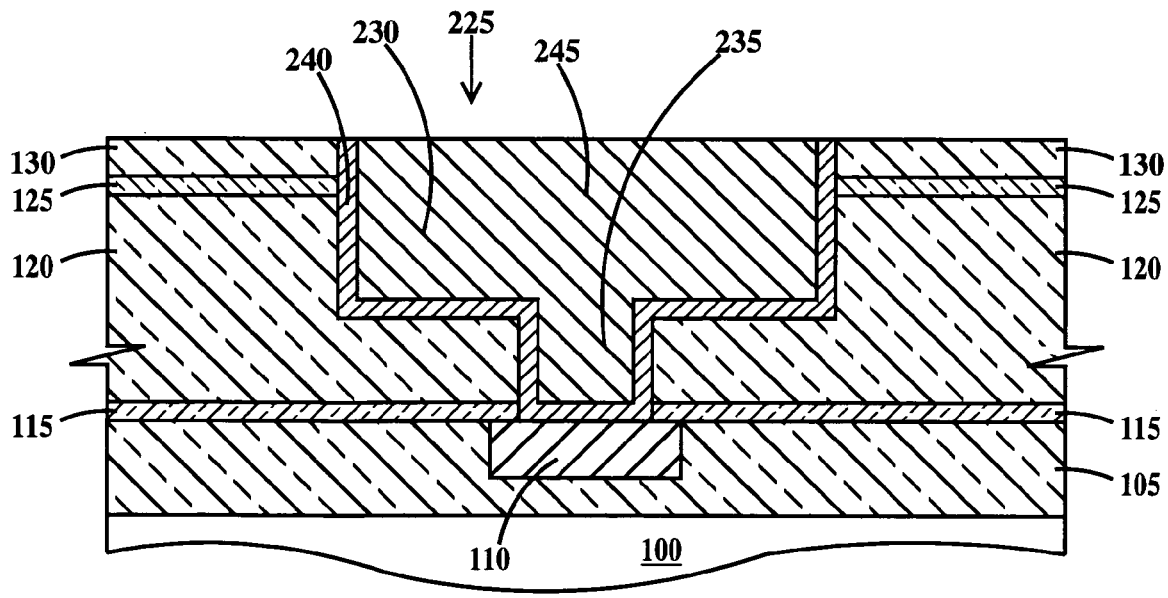

In FIG. 10, a dual damascene wire 225 includes a wire portion 230 and a via portion 235 formed in wire trench 215A (see FIG. 9) and via opening 220A (see FIG. 9) respectively as described supra. Second hardmask 140 and resist protection layer 135 are removed by the CMP process used in the dual damascene process. First hardmask 130 acts as a CMP stopping layer. In one example, dual damascene wire 225 includes a liner 240 and a core conductor 245. In one example, liner 240 comprises layers of Ti, TiN, Ta, TaN or combinations thereof. In one example, core conductor 245 comprises Cu. Dual damascene wire 225 is illustrated in direct physical and electrical contact with exemplary contact 110.

While the fourth and fifth plasma etches have been described as separate processes, the fifth plasma etch may be eliminated and the fourth plasma etch time increased to also etch through capping layer 115, though for small via openings use of the fifth plasma etch reduces plasma loading effects and improves via opening dimensional control.

Figure 11:
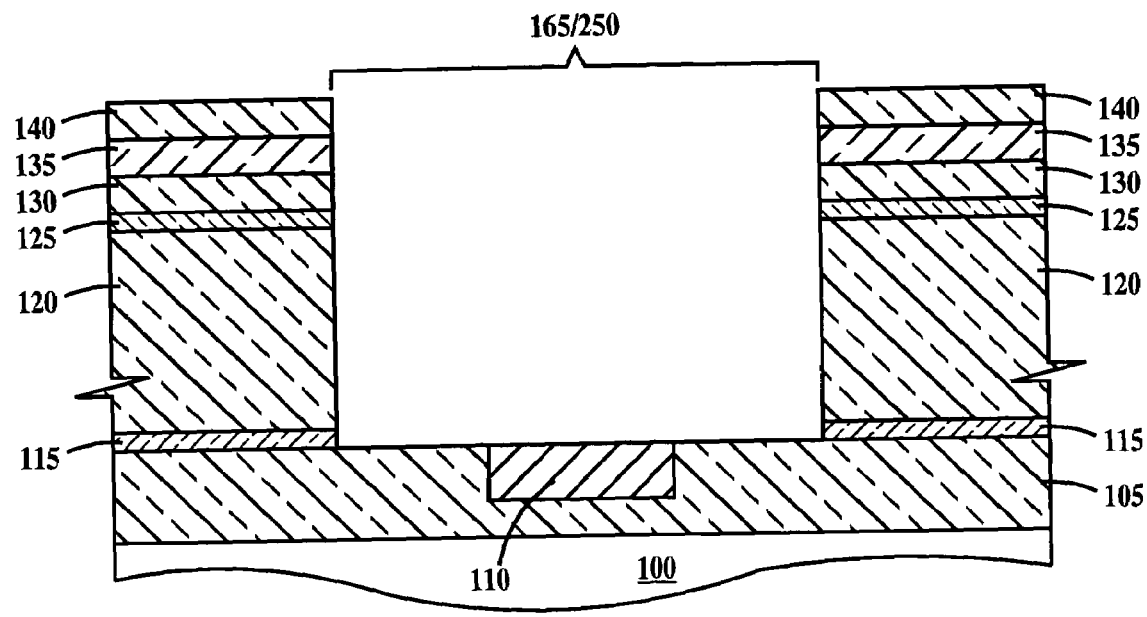
FIGS. 11 and 12 are cross-sectional views illustrating fabrication of an interconnect structure according to a second embodiment of the present invention.
Figure 12:
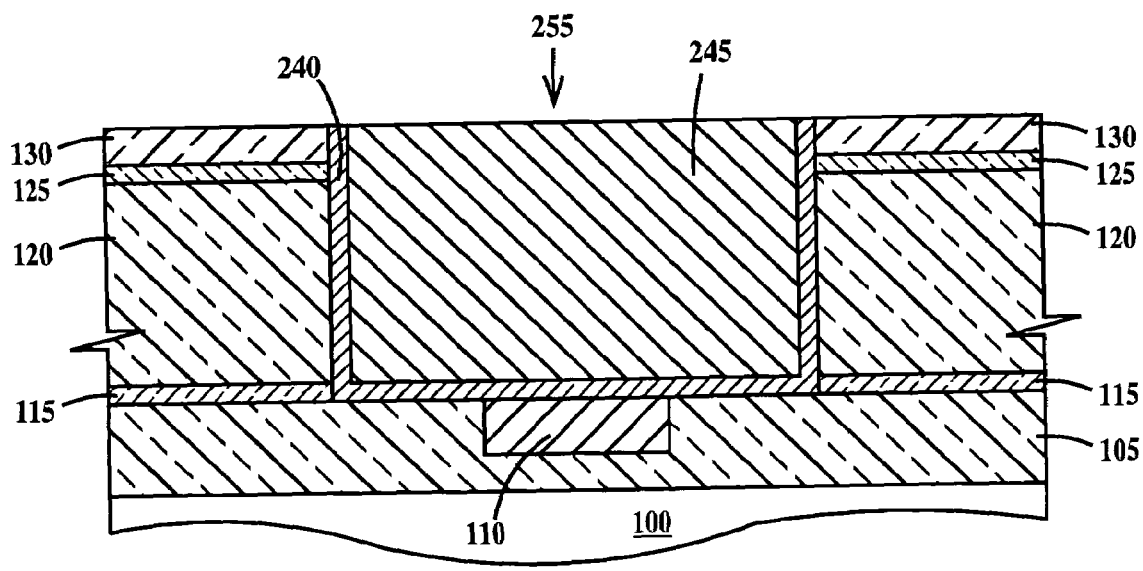

FIGS. 11 and 12 are cross-sectional views illustrating fabrication of an interconnect structure according to a second embodiment of the present invention. While the first embodiment of the present invention was directed to a dual damascene process, the second embodiment of the present invention is directed to a single damascene process. The steps illustrated in FIGS. 1, 2 and 3 and described supra, are performed immediately prior to the steps illustrated in FIGS. 11 and 12.

In FIG. 11, the third etch processes described supra is performed. The third plasma etch etches rework protection layer 135, first hardmask layer 130, adhesion layer 125 and OSG layer 120 selectively to second hardmask layer 140. A fourth plasma etch etches OSG layer 120 selectively to second hardmask layer 140 and capping layer 115. The fourth plasma etch process of the second embodiment of the present invention is essentially the same etch process as the fifth etch process of the first embodiment of the present invention described supra. Opening 165 in second hardmask layer 140 is used to define a wire trench (or a via opening) 250 in OSG layer 120 and capping layer 115.

In FIG. 12, a single damascene wire (or via or via bar) 255 includes liner 240 and a core conductor 245 and is in direct physical and electrical contact with contact 110 Second hardmask 140 and resist protection layer 135 are removed by the CMP process used in the single damascene process. First hardmask 130 acts as a CMP stopping layer.

While the third and fifth plasma etches have been described as separate processes, the fifth plasma etch may be eliminated and the third plasma etch time increased to also etch through capping layer 115.

Figures 13, 14:
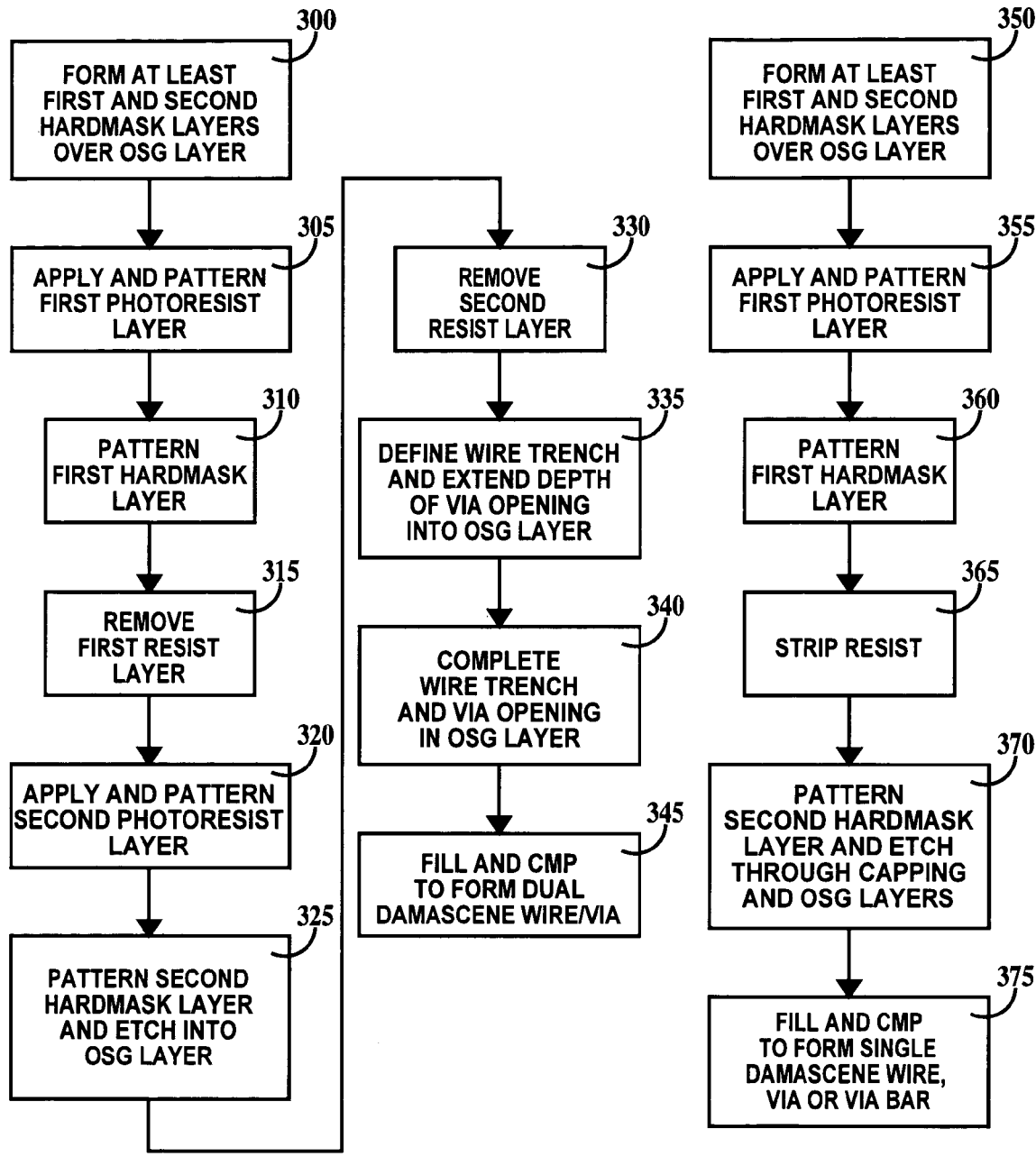
FIG. 13 is a flowchart of the method for forming the interconnect structure according to the first embodiment of the present invention.
FIG. 14 is a flowchart of the method for forming the interconnect structure according to the second embodiment of the present invention.

FIG. 13 is a flowchart of the method for forming the interconnect structure according to the first embodiment of the present invention. In step, 300 at least first and second hardmask layers are formed over an OSG layer on a substrate (which may be a porous OSG layer), the first hardmask layer being between the second hardmask and the OSG layer. An optional capping layer may be formed between the OSG layer and the first hardmask layer. An optional adhesion layer may be applied/formed between the OSG layer and the first hardmask layer. An optional rework protection layer may be formed between the first and second hardmask layers.

In step 305 a first photoresist layer is applied on the second hardmask layer. An optional first ARC may be applied to the second hardmask layer prior to applying the first photoresist layer in which case the photoresist layer is applied to the first ARC.

In step 310, the first photoresist layer is patterned and the pattern transferred to the second hardmask layer using a first plasma etch process. In step 315, the first photoresist layer is removed.

In step 320, a second photoresist layer is applied on the exposed surfaces of the first and second hardmask layers and patterned. An optional second ARC may be applied to the exposed surfaces of the first and second hardmask layers prior to applying the second photoresist layer, in which case the second photoresist layer is applied to the second ARC.

In step 325, the second photoresist pattern is transferred through the first hardmask layer and into the OSG layer using a second plasma etch process to define a via opening. If capping, rework protection, adhesion and/or second ARC layers are present, the pattern is transferred through these layers as well. In step 330 the second photoresist layer is removed.

In step, 335 a third plasma etch (using no $O_2$ or oxygen containing species) is performed, extending the pattern in the second hardmask layer into the OSG layer (and all intervening layers) to form a wire trench in the OSG layer and extend the depth of the via opening in the OSG layer.

In step 340, a fourth plasma etch is performed using no oxygen or nitrogen containing species (i. e. containing no $H_2O$, $O_2$, CO, $CO_2N_2$, $NH_3$ or other oxygen or nitrogen containing molecules, radicals or ions) in order to extend the depth of the wire trench to its final depth and extending the via opening through the OSG layer. A fifth plasma etch using no oxygen or nitrogen containing species (i.e. containing no $H_2O$, $O_2$, CO, $CO_2N_2$, $NH_3$ or other oxygen or nitrogen containing molecules, radicals or ions) is also performed in order to extend the via opening through the capping layer if present. Alternatively, the fifth plasma etch may be eliminated and the fourth plasma etch also used to etch through the capping layer.

In step 345, the wire trench and via opening are filled with metal or other electrically conductive material and planarized to form a dual damascene wire and via.

FIG. 14 is a flowchart of the method for forming the interconnect structure according to the second embodiment of the present invention. In step, 350 at least first and second hardmask layers are formed over an OSG layer on a substrate (which may be a porous OSG layer), the first hardmask being between the second hardmask and the OSG layer. An optional capping layer may be formed between the OSG layer and the first hardmask layer. An optional adhesion layer may be applied/formed between the OSG layer and the first hardmask layer. An optional rework protection layer may be formed between the first and second hardmask layers.

In step 355 a photoresist layer is applied on the second hardmask layer. An optional ARC may be applied to the second hardmask layer prior to applying the photoresist layer, in which case the photoresist layer is applied to the ARC.

In step 360, the photoresist layer is patterned and the pattern transferred to the second hardmask layer using a first plasma etch process. In step 365, the first photoresist layer is removed.

In step 365, the second hardmask pattern is transferred through the first hardmask layer and into the OSG using a second plasma etch process to define a wire trench or via or via bar opening. If capping, rework protection, adhesion layers and/or ARC are present, the pattern is transferred through these layers as well.

In step, 370 a third plasma etch using no oxygen or nitrogen containing species (i.e. containing no $H_2O$, $O_2$, CO, $CO_2N_2$, $NH_3$ or other oxygen or nitrogen containing molecules, radicals or ions) in order to extend the pattern in the second hardmask layer into the OSG layer (and all intervening layers) to complete the wire trench or via opening in the OSG layer. A fourth plasma etch is also performed, extending the wire trench or via opening through the capping layer if present. Alternatively, the fourth plasma etch may be eliminated and the third plasma etch also used to etch through the capping layer. (Note, the fourth plasma etch of the second embodiment is essentially the same as the fifth plasma etch of the first embodiment.)

In step 375, the wire trench and via opening are filled with metal or other electrically conductive material and planarized to form a single damascene wire, via or via bar.

Thus, the various embodiments of the present invention methods of forming interconnect structures in OSG dielectrics that do not cause photoresist poisoning, are insensitive to OSG carbon-depletion and are less susceptible to interconnect/OSG interface adhesion failure.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
forming an organo-silicate glass layer over a substrate;
forming a first hardmask layer over said organo-silicate glass layer;
forming a second hardmask layer over said first hardmask layer;
forming a first photoresist layer over said second hardmask layer;
removing a region of said first photoresist layer;
removing a region of said second hardmask layer where said second hardmask layer is not protected by said first photoresist layer using a first plasma etch process to define a wire pattern in said second hardmask layer;
removing said first photoresist layer;
forming a second photoresist layer over said second hardmask layer and exposed surfaces of said first hardmask layer;
removing a region of said second photoresist layer;
performing a second plasma etch process to remove a region of said first hardmask layer to define a via pattern in said first hardmask layer, said via pattern aligned at least partially within said wire pattern, said second plasma etch removing a less than whole portion of a first region of said organo-silicate glass layer where said organo-silicate layer is not protected by said first hardmask layer;
removing said second photoresist layer;
performing a third plasma etch process, said third plasma process removing said first hardmask layer in regions of said first hardmask layer not protected by said second hardmask layer, removing a less than whole portion of a second region of said organo-silicate glass layer within a perimeter of said wire pattern and removing an additional less than whole portion of said organo-silicate glass layer in said first region of said organo-silicate glass layer; and
performing a fourth plasma etch process, said fourth plasma etch process removing an additional less than whole portion of said organo-silicate glass layer in said second region of said organo-silicate glass layer to form a wire trench and removing all remaining portions of said organo-silicate glass layer in said first region of said organo-silicate glass layer to form a via opening.

2. The method of claim 1, wherein said fourth plasma etch process includes no oxygen or nitrogen containing species.

3. The method of claim 2, further including:
after said forming said wire trench and via opening, filling said wire trench and via with an electrically conductive material; and
performing a chemical mechanical polish to remove said first hardmask layer and co-planarize a top surface of said first hardmask layer and a top surface of said electrically conductive material.

4. The method of claim 1, wherein said organo-silicate glass layer includes about 10% to about 70% voids by volume.

5. The method of claim 1, wherein said organo-silicate glass layer comprises about 10% to about 40% silicon, about 0% to about 30% carbon, about 0% to about 30% nitrogen, and about 20% to about 50% hydrogen.

6. The method of claim 1, further including:
forming a capping layer between said organo-silicate glass layer and said substrate; and
after said performing said fourth plasma etch, removing said capping layer in regions of said capping layer not protected by said organo-silicate glass layer using a fifth plasma etch process, said fifth plasma etch process including no oxygen or nitrogen containing species.

7. The method of claim 1, further including:
forming an adhesion layer between said organo-silicate glass layer and said first hardmask layer;
removing a first region of said adhesion layer not protected by said first hardmask layer while performing said second plasma etch; and
removing a second region of said adhesion layer not protected by said second hardmask layer while performing said third plasma etch.

8. The method of claim 1, further including:
forming a rework protection layer between said first hardmask layer and said second hardmask layer;
removing a first region of said rework protection layer not protected by said first hardmask layer while performing said second plasma etch; and
removing a second region of said a rework protection layer not protected by said second hardmask layer while performing said third plasma etch.

9. The method of claim 1, further including:
forming a first anti-reflective coating between said second hardmask layer and said first photoresist layer;

removing a region of said first anti-reflective coating not protected by said first photoresist layer while performing said first plasma etch; and removing all remaining first anti-reflective coating during said removing said first photoresist layer.

10. The method of claim 1, further including:

forming a second anti-reflective coating between said second hardmask layer and exposed surfaces of said first hardmask layer, and said second photoresist layer;

removing a first region of said second anti-reflective coating not protected by said second photoresist layer while performing said third plasma etch; and removing all remaining second anti-reflective coating during said removing said second photoresist layer.

11. The method of claim 1, wherein either said second plasma etch process, said removal of said second photoresist layer or both said second plasma etch process and said removal of said second photoresist layer generate a damaged region of said organo-silicate glass layer and wherein said third, fourth or both said third and forth plasma etch process remove said damaged region without damaging any other regions of said organo-silicate glass layer.

* * * * *